United States Patent [19]

Röhrich et al.

[11] 4,450,588

[45] May 22, 1984

[54] TUNING SYSTEM FOR A HIGH FREQUENCY RECEIVER UTILIZING A CONTROLLABLE INDUCTOR

[75] Inventors: Manfred Röhrich, Marxzell-Burbach; Stefan Brinkhaus, Remchingen-Wilferdingen, both of Fed. Rep. of Germany

[73] Assignee: Becker Autoradiowerk GmbH, Ittersbach, Fed. Rep. of Germany

[21] Appl. No.: 368,316

[22] Filed: Apr. 14, 1982

[30] Foreign Application Priority Data

Apr. 15, 1981 [DE] Fed. Rep. of Germany ....... 3115291

[51] Int. Cl.³ ............................................. H04B 1/16
[52] U.S. Cl. ..................................... 455/192; 455/195; 455/193; 455/261; 331/36 L; 334/71
[58] Field of Search ............... 455/150, 192, 193, 195, 455/261, 291, 292; 331/181, 36 L; 334/4, 71; 324/788, 81, 117 R

[56] References Cited

U.S. PATENT DOCUMENTS

| | | | |
|---|---|---|---|
| 2,302,893 | 11/1942 | Roberts | 331/36 L |
| 2,897,352 | 7/1959 | Smith-Vaniz, Jr. | 331/36 L |
| 2,926,240 | 2/1960 | Gollub | 455/195 |
| 3,076,943 | 2/1963 | Cooperman | 455/261 |

*Primary Examiner*—Jin F. Ng
*Attorney, Agent, or Firm*—Gerald J. Ferguson, Jr.; Joseph J. Baker

[57] ABSTRACT

The tuning system for a high frequency receiver, particularly an AM receiver for vehicles, comprises a tunable input resonance circuit having a variable inductance formed by the signal winding of a controllable inductor. The control winding of the inductor is supplied with a control current. The control winding is simultaneously used as the frequency determinative element of an auxiliary oscillator. A frequency control loop is used to adjust the oscillating frequency of the auxiliary oscillator by adjustment of the control current. The tuning system allows a selective coupling between the tuned antenna input circuit and the rf front end of the receiver.

22 Claims, 5 Drawing Figures $f_1 = F(f_2)$

TUNING SYSTEM FOR A HIGH FREQUENCY RECEIVER UTILIZING A CONTROLLABLE INDUCTOR

This invention relates to a tuning system for high frequency receivers comprising at least one tunable resonance circuit including a variable inductivity element.

The tuning of the various resonance circuits of a high frequency receiver may be achieved by varying the capacity of capacitive elements or by varying the inductivity of inductive elements. Recent receiver systems are provided with variable capacitty diodes provided in the tuning circuits and the capacity value of which is controlled by a variable direct voltage. Use of a direct voltage for the purpose of tuning the tunable resonance circuits allows the development of electronic tuning systems comprising frequency control loops assuring high stability of the reception frequency to which the receiver is tuned. In many cases, however, the use of variable capacity diodes causes a substantial reduction of the signal to noise ratio. A typical example is the tuning of the antenna circuit in the front end of a radio receiver connected to an antenna of rod type such as those generally used in vehicels. At relatively low frequencies (long, medium and short wave bands), an antenna of rod type, particularly in a vehicle, has a relatively high antenna capacity of about 50 to 100 pF so that a selective coupling of the antenna to the front end of the receiver would require complex and expensive coupling circuits and still cause a substantial reduction of the signal to noise ratio. On the other hand, using an aperiodic coupling between the antenna and the front end of the receiver would substantially deteriorate the selectivity and the behaviour at high rf input levels.

Tuning an antenna circuit using a variable inductive element would not cause the above problems, but rather permit the selective coupling between the antenna and the front end of the receiver, simultaneously allowing an optimum signal to noise ratio. Therefore, conventional tuning circuits often comprise a variable inductance, the so-called variometer. A variometer is an inductance the inductivity value of which can be adjusted by mechanical means, i.e. by adjustment of the core positions within the coil of the inductance. Other variable inductance elements are controllable inductors. Controllable inductors may be tuned by supplying a controlled current to the control winding of the inductor. However, the use of an inductor as a variable inductance element in a tuning circuit has not been seriously contemplated before in view of the large tolerance range of usual inductors leading to frequency shifts between the different tuned resonance circuits of the receiver. In addition, the inductivity-control current characteristic of an inductor is subject to fluctuations due to the remanence of the used ferrite cores and to temperature changes.

It is a primary object of the invention to provide a tuning system for a receiver allowing an electronic tuning control.

It is a further object of the invention to provide an electronically controlled tuning system allowing a matched coupling between the antenna and the rf front end of the receiver to achieve an optimum signal to noise ratio, an optimum selectivity and a superior behaviour at high rf input levels.

It is a still further object of the invention to provide an electronically controlled tuning system comprising a variable inductance element and allowing stable operation at the desired reception frequency.

In accordance with the invention, a tuning system comprises a variable inductance element in at least one tunable resonance circuit, the variable inductance being formed by the signal winding of a controllable inductor the control winding of which is fed by a control current, the control winding being simultaneously used as the frequency determinative element of an auxiliary oscillator, and a frequency control loop for regulation of the oscillating frequency of the auxiliary oscillator by adjustment of the control current being provided.

In the inventive tuning system, the above mentioned inherent inductor features do not affect the performance of the receiver equipped therewith. Specifically, the large tolerance range of the inductivity-control current characteristic has no negative influence on the performance, and variations of this characteristic due to remanence and temperature effects are without negative influence on the stability of the adjusted tuning frequency.

The inventive tuning system allows an optimum receiver performance comparable with the performance of conventional receivers equipped with variometers. The signal to noise ratio is improved by about 10 to 15 dB over tuning systems equipped with variable capacity diodes. The invention is based on the finding that in conventional controllable inductors the ratio of the inductivity of the signal 1 winding to the inductivity of the control winding remains constant without being influenced by the tolerance range and by remanence and temperature effects. In general, it would be sufficient to measure the inductivity of the control winding to adjust the control current in such a manner that the corresponding inductivity of the signal winding forming part of the tunable antenna circuit has the desired value. In accordance with a particular feature of the invention, rather than measuring the inductivity of the control winding, the frequency of an auxiliary oscillator is measured, this auxiliary oscillator comprising the control winding of the inductor as a frequency determinative member. In fact, just as the ratio of the operating inductivity to the control inductivity of the inductor, the ratio of the tuning frequency to the oscillating frequency of the auxiliary oscillator is independent on the above mentioned tolerance range and remanence temperature effects.

Further objects and features of the invention will stand out from the following description of non-limitative embodiments with reference to the drawings.

Figure 3:
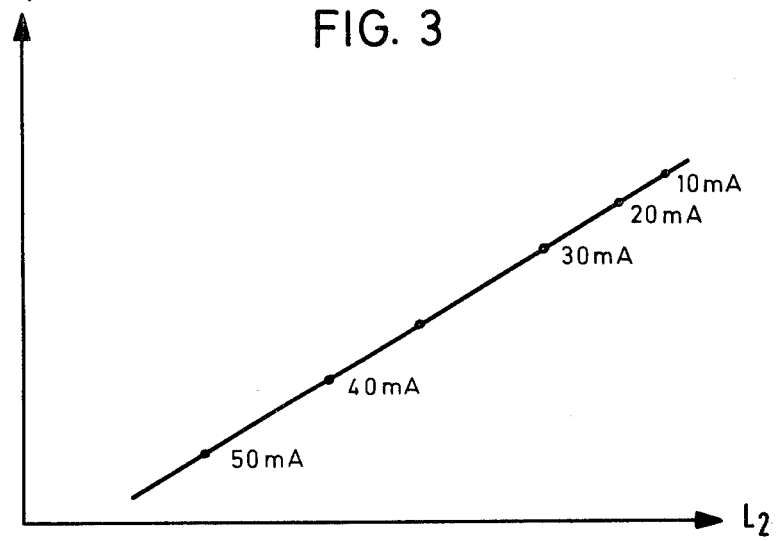
Figure 4:
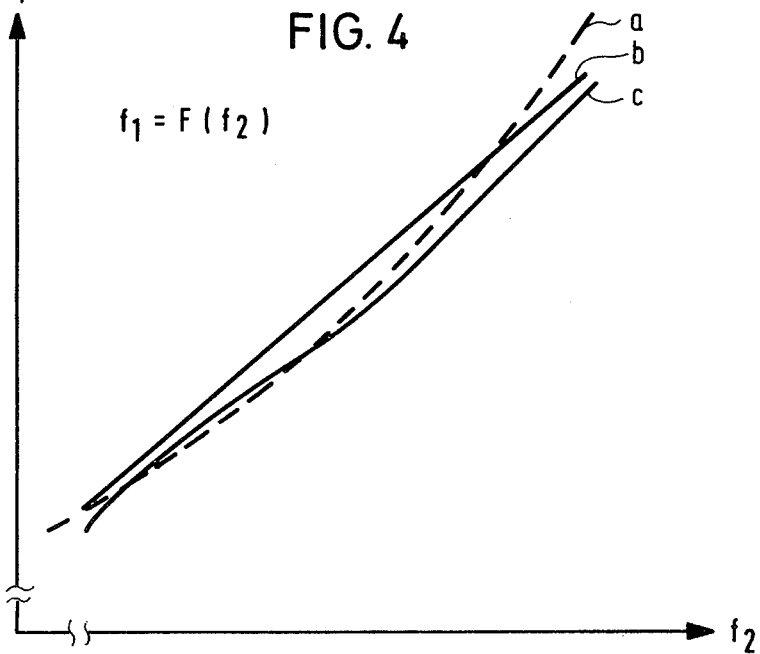
Figure 5:
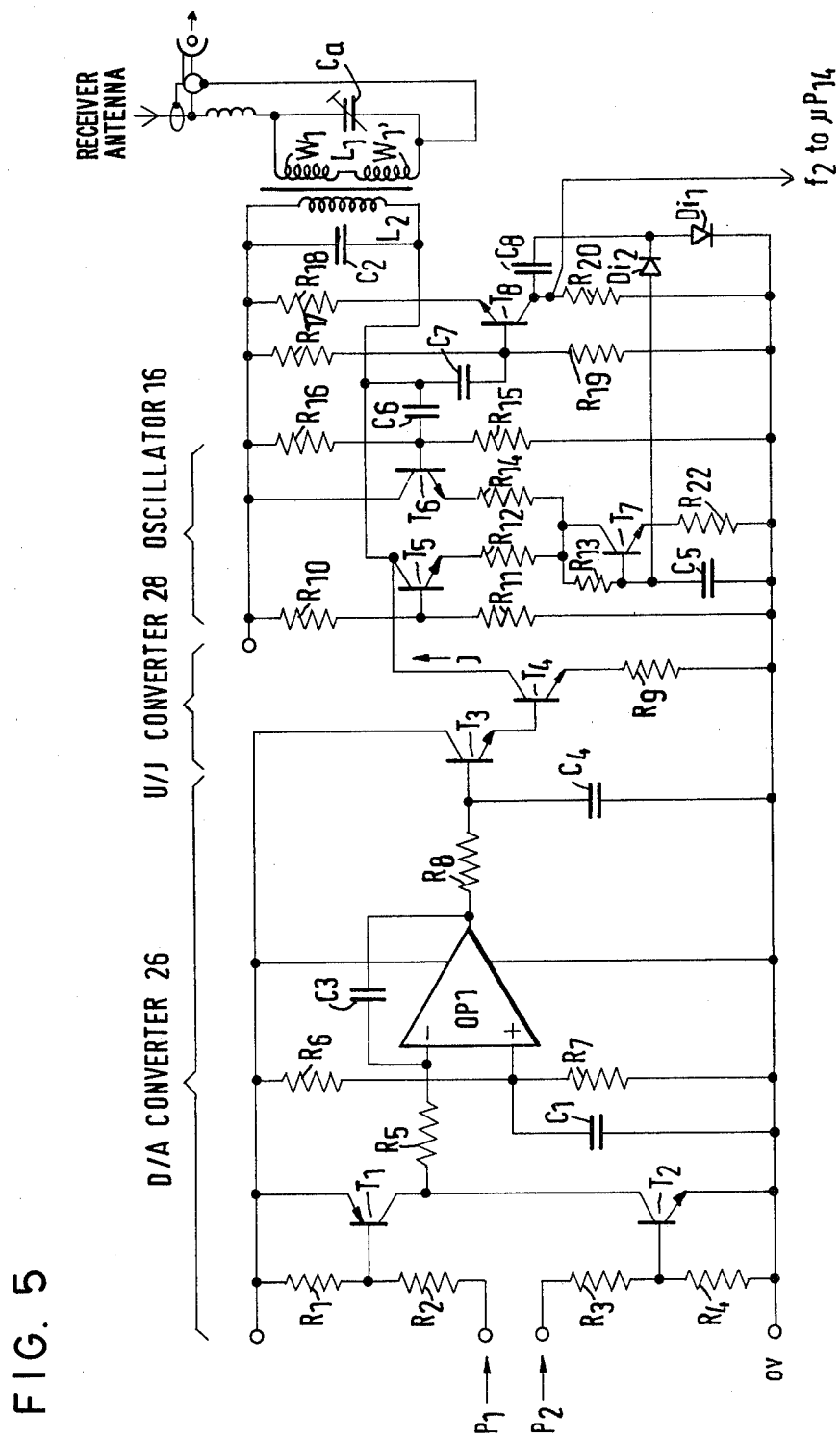

FIGS. 3 and 4 characteristic diagrams illustrating the operation of the inventive tuning system; and FIG. 5 a detailed circuit diagram of a preferred embodiment comprising a digital-analog converter and an auxiliary oscillator.

Figure 1:
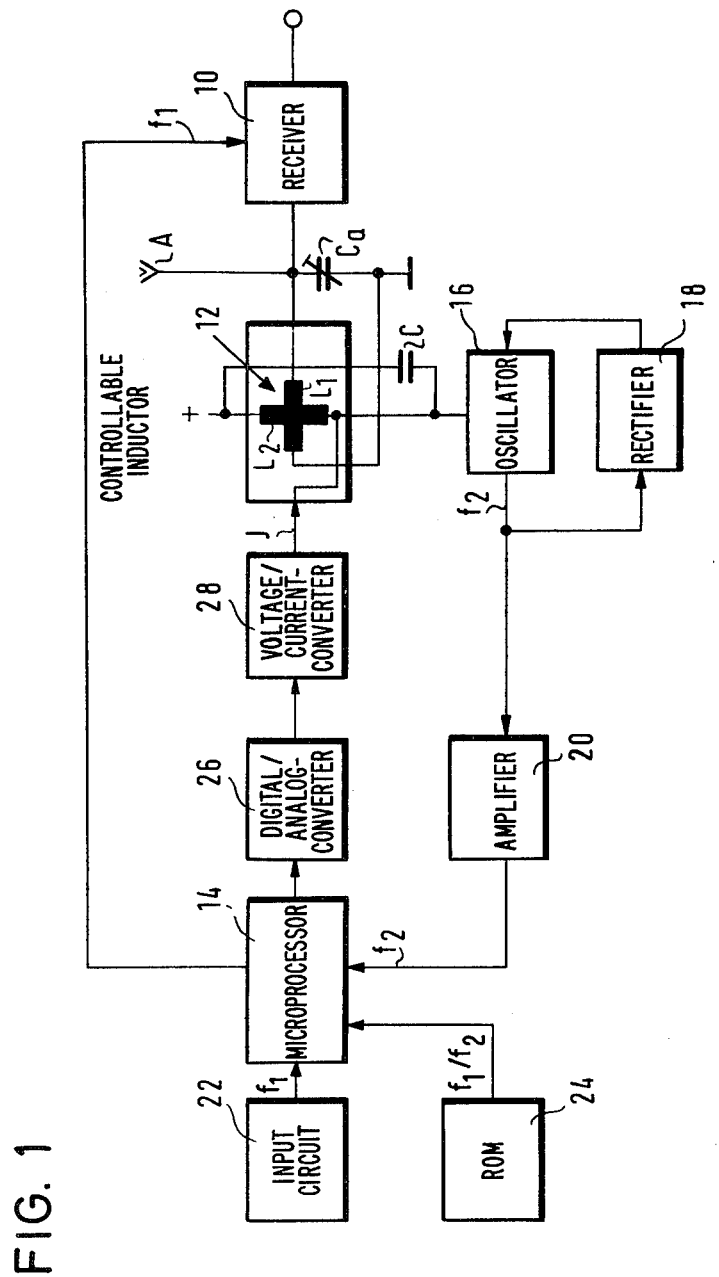
FIG. 1 shows a schematic diagram of a preferred embodiment of the inventive tuning system.

In the preferred embodiment shown in FIG. 1, the matched antenna circuit of a receiver 10 comprises the signal coil $L_1$ of a controllable inductor 12 having a parallel trimmer capacitor $C_a$, the connection between a rod typ antenna A, the signal winding $L_1$ of the transductors 12 and the trimmer capacitor $C_a$ being connected to the input of the front end of the receiver 10. The receiver 10 is dimensioned for AM reception in the short, medium and long wave ranges. Obviously, the receiver may be dimensioned for FM reception, signal side band modulation etc. and for any desired frequency range.

The tuning of the antenna circuit is achieved by supplying a control current J to the control winding $L_2$ of the inductor 12, the intensity of the control current being controlled by a frequency control loop further described below. The tuning of the further tunable resonance circuits of the receiver 10 is made in matched relation with the tuning of the antenna circuit using a frequency control loop of conventional design. The antenna circuit as well as the other tunable resonance circuits of the receiver 10 are tuned to the reception frequency $f_1$. The control signal required for the tuning of the other tunable resonance circuits of the receiver 10 is generated by a microprocessor 14 which is also used, in addition to its contribution to the frequency control loop, for controlling the operation of the receiver, and eventually of other features such as time display etc. The frequency control loop used in the inventive tuning system comprises microprocessor 14 as a basic control element, as further disclosed below.

The control winding $L_2$ of the inductor 12 to which the control current J is supplied, is the frequency determinative element of an auxiliary oscillator 16, together with a parallel capacitor C. The auxiliary oscillator 16 is dimensioned in such a manner that the current induced thereby in the control winding $L_2$ is very low compared to the control current J so that its influence on the inductivity of the control winding is insignificant. The oscillating signal generated by the auxiliary oscillator 16 has an auxiliary frequency $f_2$ which is very small in comparison to the reception frequency $f_1$ to which the receiver 10 is desired to be tuned. An amplitude control circuit 18 is used to keep the output signal of the auxiliary oscillator 16 substantially free from harmonics, as these harmonics would possibly fall into the range of the reception frequency and give rise to interference. The output signal of the auxiliary oscillator 16 is supplied to the microprocessor 14 through a level adjustment amplifier 20.

The desired reception frequency $f_1$ is introduced into the microprocessor 14 through an input circuit 22, for example a mechanical adjustment member or a keyboard, or even an automatic scanning circuit etc. A read-only memory 24 is connected to the microprocessor 14. In the read-only memory 24, predetermined ratios of the reception frequencies $f_1$ to respectively associated oscillating frequencies $f_2$ of the auxiliary oscillator 16 are stored. For any desired reception frequency $f_1$ introduced into the microprocessor 14 through the input circuit 22, the microprocessor 14 will read the corresponding ratio $f_1/f_2$ from the read-only memory 24. The output signal of the microprocessor 14 is supplied to a digital-analog converter 26 followed by a voltage-current converter transforming the analog output voltage supplied by the digital-analog converter 26 into a control current J. The control current J is supplied to the control winding $L_2$ of the 12. Therefore, the auxiliary oscillator will operate on an oscillating frequency corresponding to the predetermined ratio of $f_1/f_2$. As long as the oscillating frequency $f_2$ is different from the prescribed value corresponding to the associated ratio of $f_1/f_2$, the control current J will be adjusted in stepped fashion, until the oscillating frequency $f_2$ is that prescribed by the stored ratio $f_1/f_2$ associated with the desired reception $f_1$.

Figure 2:
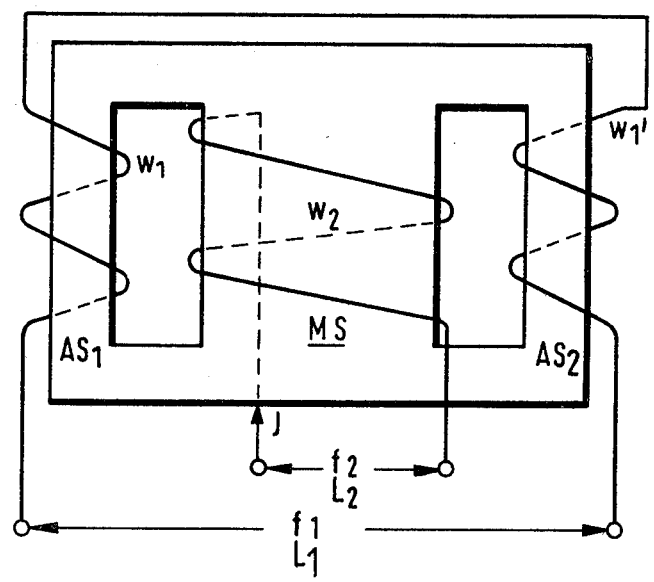
FIG. 2 shows a schematic diagram of a controllable inductor used in the tuning system of FIG. 1.

The operation of the tuning system shown in FIG. 1 and the underlying inventive concept will appear from the following disclosure with reference to FIGS. 2, 3 and 4.

FIG. 2 shows a conventional inductor of the twin core type, having a center leg MS and two outer legs $AS_1$, $AS_2$. The operating winding is formed by two winding portions $W_1$, $W_1'$ carried by the outer legs $AS_1$, $AS_2$ respectively. Both winding portions $W_1$, $W_1'$ are symmetrical and have the same number of turns. The control winding $W_2$ is carried by the center leg MS. The control winding $W_2$ is associated with an inductivity $L_2$, whereas the two winding portions $W_1$, $W_1'$ are series connected in the opposed winding sense and associated with the signal inductivity $L_1$. By connecting the two winding portions $W_1$, $W_1'$ in series and in opposed winding sense relationship, any signal components induced by the control winding $W_2$ will cancel each other in the signal winding. This is important because the output signal of the auxiliary oscillator 16 and having the frequency $f_2$ will appear in the control winding $W_2$. However, this oscillating frequency $f_2$ should not penetrate into the antenna circuit. As a complete cancellation of the induced signal components is impossible in view of unperfect symmetry of the two winding portions $W_1$, $W_1'$, the oscillating frequency $f_2$ of the auxiliary oscillator 16 is selected to be much smaller than the reception frequency $f_1$; in addition, the amplitude of the auxiliary oscillator 16 is adjusted to be substantially free of harmonics. The level of the output signal of the auxiliary oscillator 16 is maintained on a very low value by the amplitude adjustment circuit 18, providing a substantially sinusoidal output signal.

In a conventional inductor, the following relations apply to the signal inductivity $L_1$ and the control inductivity $L_2$:

$$L_1 = \frac{2W_1^2 \cdot \mu_1 \cdot A_1}{l_1} \quad (1)$$

$$L_2 = \frac{W_2^2}{\frac{l_2}{\mu_2 \cdot A_2} + \frac{l_1}{2\mu_1 \cdot A_1}} \quad (2)$$

$L_1$ = signal inductivity (of the tunable rf circuit)
$L_2$ = control inductivity
$l_1$ = length of the magnetic field lines of the outer legs
$l_2$ = length of the magnetic field lines of the center leg
$A_1$ = cross-sectional area of the outer legs
$A_2$ = cross-sectional area of the center leg
$\mu_1$ = effective permeability of the ferrite material of the outer legs
$\mu_2$ = effective permeability of the ferrite material of the center leg
$W_1$ = number of turns of the signal winding
$W_2$ = number of turns of the control winding.

The ratio of the signal inductivity $L_1$ to the control inductivity $L_2$ may be derived from (1) and (2):

$$\frac{L_1}{L_2} = \frac{4W_1^2 \cdot \mu_1 \cdot A_1 \cdot \left( \frac{l_2}{\mu_2 A_2} + \frac{l_1}{2\mu_1 A_1} \right)}{W_2^2 \cdot l_1} \quad (3)$$

$$= \frac{4W_1^2}{W_2^2} \cdot \left( \frac{l_2\mu_1 A_1}{l_1\mu_2 A_2} + \frac{l_1\mu_1 A_1}{2l_1\mu_1 A_1} \right)$$

$$= \frac{4W_1^2}{W_2^2} \cdot \left( \frac{l_2}{l_1} \cdot \frac{\mu_1}{\mu_2} \cdot \frac{A_1}{A_2} + \frac{1}{2} \right)$$

$$\frac{L_1}{L_2} = \frac{2W_1^2}{W_2^2} \cdot \left( 2 \cdot \frac{l_2}{l_1} \cdot \frac{\mu_1}{\mu_2} \cdot \frac{A_1}{A_2} + 1 \right)$$

As the number of turns $W_1$ of the signal winding, the cross sectional area of the outer legs and the legs $l_1$ of the magnetic field lines in the outer legs are predetermined for a inductor of given type, it will be understood from (1) that the signal inductivity $L_1$ may only be varied by varying the permeability $\mu_1$ of the ferrite material of the outer legs.

Generally, the following relation applies to any inductance:

$$\mu = \frac{\phi \cdot l}{J \cdot W \cdot A} \quad (4)$$

wherein $\mu$ is the effective permeability of the coil core, $\phi$ the magnetic flux, l the length of the magnetic field lines within the coil core, J the current flowing through the coil, W the number of turns of the coil and A the cross-section of the coil core.

The magnetic flux depends on the operating point on the magnetic characteristic of the used ferrite material and therefore depends on the remanence and the temperature coefficient of this ferrite material. In an inductor having a constant effective permeability $\mu$, therefore, the control current J will be both temperature and time dependent, so that it cannot be used as a reference to determine the value of the signal inductivity $L_1$.

In any given inductor, the effective permeability $\mu_1$ of the outer legs is associated with an effective permeability $\mu_2$ of the center leg, as determined by the geometry of the inductor and by the operating point on the magnetic characteristic. If the signal inductivity $L_1$ is maintained constant by adjusting the control current J to compensate for the fluctuations of the magnetic flux $\phi$ caused by the temperature and remanence fluctuations, the ratio $\mu_1/\mu_2$ will be maintained constant. Thus, in the above relation (3) the ratio $L_1/L_2$ will be maintained constant, too.

Thus, the signal inductivity $L_1$ may be maintained constant by determination of the associated control inductivity $L_2$ and adjustment of the control current J.

FIG. 3 shows how the signal inductivity $L_1$ depends on the control inductivity $L_2$ of a given inductor and for different values of the control current J. It appears that the various values of the control current J are lying on a straight line.

Generally, in accordance with the invention, the control inductivity $L_2$ may be determined by any suitable method. In a preferred embodiment, however, the value of the control inductivity $L_2$ is determined by the oscillating frequency of the auxiliary oscillator 16, as in the embodiment of FIG. 1. As the straight line shown in the diagram of FIG. 3 is shifted from the zero point of the coordinate system, the relation between the reception frequency $f_1$ and the oscillating frequency $f_2$ of the auxiliary oscillator 16 is unlinear. This relation is shown as the dashed curve a in FIG. 4. This is a curved characteristic. An important feature of the preferred embodiment of the invention is the fact that only a limited number of values of the ratio between the reception frequency $f_1$ and the oscillating frequency $f_2$ of the auxiliary oscillator 16 will be sufficient to give a suitable approximation of this unlinear relationship. These values stored in the read-only memory 24 may be accessed by the frequency control circuit of the tuning system. The values required for an approximation of the characteristic shown in FIG. 4 are determined empirically and then stored in the read-only memory 24. In accordance with another embodiment, the curved characteristic is calculated by a microprocessor, the microprocessor having sufficient calculating capacity and speed to perform this operation.

In order to have only a few values to be stored in the read-only memory 24, a control characteristic $f_1 = F(f_2)$ for the particular inductor type used is measured at incremental frequency steps of e.g. 100 KHz of the reception frequency $f_1$, and the measured values are then stored in the read-only memory 24. The intermediate points of the control characteristic lying between the incremental frequency steps are calculated by the microprocessor 14 using an interpolation method. The microprocessor 14 then generates a digital output converted into the required control current J by the digital-analog converter 26 and the following voltage-current converter 28. The auxiliary oscillator 16 will be oscillating on the frequency $f_2$ determined by the control inductance $L_2$ and by the capacitor C, the oscillator output being fed to the microprocessor 14 through amplifier 20. The microprocessor 14 will compared the current value of the oscillating frequency with the required frequency $f_2$ and will stepwise adjust the control current J until the current frequency has become the required frequency $f_2$. At this time, the operating inductance $L_1$ will also have its prescribed value, forming a resonance circuit together with the capacity of a rod type antenna A and the trimmer capacitor $C_a$, the resonance circuit being tuned to the desired value $f_1$ of the reception frequency. The trimmer capacitor $C_a$ is used to compensate for different capacity values of the rod type antenna.

Should the resonance frequency $f_1$ to which the antenna input circuit is tuned change as a consequence of remanence decay or temperature changes of the inductor 12, the frequency $f_2$ of the auxiliary oscillator 16 would change in accordance with the characteristic a of FIG. 4 (dashed curve), and the microprocessor 14 would readjust the control current J until the prescribed value $f_2$ and thus of $f_1$, is restored.

In a preferred embodiment of the invention, the tuning system is improved by using a particular type of inductor 12, as disclosed below.

Referring again to FIG. 2, the magnetic field induced by the control winding $W_2$ within the center leg MS is symmetrically divided between both outer legs $AS_1$, $AS_2$. Thus the magnetic flux $\phi_1$ in the center leg is twice the magnetic flux $\phi_2$ in the two outer legs.

$$\phi_1 = 2\phi_2 \quad (5)$$

In accordance with the law of electromagnetic induction:

$$B = (\phi/A) \quad (6)$$

Thus $$B_1 = (\phi_1/A_1) \qquad (7)$$

and $$B_2 = (\phi_2/A_2) \qquad (8)$$

From (7) and (8):

$$\frac{B_1}{B_2} = \frac{\phi_1}{A_1} \cdot \frac{A_2}{\phi_2} \qquad (9)$$

Inserting (5) into (9) yields:

$$\frac{B_1}{B_2} = \frac{2\phi_2}{A_1} \cdot \frac{A_2}{\phi_2} = \frac{2A_2}{A_1} \qquad (10)$$

For the particular case $A_1 = 2A_2$:

$$\frac{B_1}{B_2} = 1 \qquad B_1 = B_2.$$

In a homogeneous magnetic material, the same values of the magnetic induction B are associated with the same magnetic field strength H and the same values of permeability $\mu$, in accordance with the relation $\mu = B/H$.

Thus, for $B_1 = B_2$, $\mu_1 = \mu_2$.

Inserting the particular case $B_1 = B_2$ and $A_1 = 2A_2$ into (3) yields the simplified relation:

$$\frac{L_1}{L_2} = \frac{2W_1^2}{W_2^2} \cdot \left(\frac{4 \cdot l_2}{l_1} + 1\right) \qquad (11)$$

This relation only contains predetermined dimensions determined by the constructional features of the inductor. Thus, the ratio $L_1/L_2$ is constant, just as the ratio $f_1/f_1$.

A thorough examination, however, will show that the ratio $L_1/L_2$ is not strictly constant because, for higher magnetic field densities, part of the magnetic field lines will form a stray field rather than passing through the outer legs. Under these circumstances, the relation $B_1 = B_2$ will not hold strictly, i.e. $A_1:A_2 > 2.0$.

In accordance with a preferred embodiment, the reatio $A_1:A_2$ is selected to have a value of approximately 2.5, and it was found that this value gives optimum results with respect to maintaining a constant ratio $f_1/f_2$. In other embodiments of the twin core, the ratio $A_1/A_2$ is within a range of 2.0 to 2.7, preferably 2.3 to 2.6.

In FIG. 4, the straight full line b is the control characteristic for strictly identical values of $B_1$ and $B_2$. The curved line c also shown in full lines represents a control characteristic of an inductor in which the ratio $A_1/A_2$ is 2.45. This value has shown to yield an optimum result.

By the above embodiment of the inductor, the control characteristic $f_1 = F(f_2)$ becomes substantially linear so that only a few values of the ratio $f_1/f_2$ will have to be stored in the read-only memory 24, particularly the initial and a final value of the desired frequency range.

Reference is now had to FIG. 5 showing a detailed circuit diagram of a preferred embodiment of the tuning system.

The digital-analog converter is formed as an integrating circuit integrating the pulse sequence delivered by microprocessor 14 at its output terminals P1, P2. The integrating circuit is formed by an operational amplifier OP1 the output of which is fed back to its inverting input through a capacitor $C_3$. The positive input receives a constant reference potential derived from a voltage divider comprising resistors $R_6$, $R_7$. The reference potential is stabilized by capacitor $C_1$. The inverting input of operational amplifier OP1 is supplied with either a positive or a negative input signal through resistor $R_5$, depending on the conductive state of one of two transistors $T_1$, $T_2$ connected in series between the supply voltage terminals. Transistor $T_1$ is controlled through input P1 and a voltage divider formed by two resistors $R_1$, $R_2$ whereas transistor $T_2$ is controlled through terminal P2 and a voltage divider formed by resistor $R_3/R_4$. The output signal of operational amplifier OP1 is supplied to a voltage-current converter through a resistor $R_8$ and a storing capacitor $C_4$, the voltage-current converter being formed by two transistors $T_3$, $T_4$. The output current supplied by transistor $T_4$ is the control current J supplied to one terminal of the control winding $L_2$.

In accordance with the embodiment shown in FIG. 5, the auxiliary oscillator 16 is formed by a transistor $T_5$ the collector of which is connected to the same terminal as the collector of transistor $T_4$, and further comprises transistor $T_6$ the base of which is controlled by the collector of transistor $T_5$ through capacitor $C_6$, and a constant current source formed by a transistor $T_7$ the collector of which is connected with the emitters of transistors $T_5$ and $T_6$, through resistors $R_{12}$ and $R_{14}$, respectively. The emitter of transistor $T_7$ is connected to ground through resistor $R_{22}$, and its base is supplied with a control signal generated by diodes Di1, Di2 and smoothed by capacitor $C_5$. The collector of transistor $C_7$ supplies a constant current depending on the control signal applied to its base, and the constant current is supplied to the emitters of transistors $T_5$, $T_6$. The constant current supplied by transistor $T_7$ thus divides between the resistors $R_{12}$ and $R_{14}$. When the voltage drop at any of resistors $R_{12}$, $R_{14}$ increases, the voltage drop in the other of these resistors will therefore be reduced. The base of transistor $T_5$ is connected to a constant potential derived from a voltage divider fromed by resistors $R_{10}$, $R_{11}$. In similar manner, the base of transistor $T_6$ the collector of which is supplied with the positive supply voltage terminal, is supplied with a constant bias potential derived from a voltage divider formed by resistors $R_{16}$, $R_{15}$, but is also controlled by the collector circuit of transistors $T_5$ through capacitor $C_6$ providing a positive feed-back to satisfy the oscillation condiction. The oscillating frequency will be frequency $f_2$ determined by the parallel resonance circuit formed of the control inductance $F_2$ and capacitor $C_2$.

The control signal controlling the base of transistor $T_7$ is derived from the output signal of the auxiliary oscillator through capacitor $C_7$ of which one terminal is connected to the collector of transistor $T_5$ and one terminal is connected to the base of an amplifying transistor $T_8$. The amplifier signal is derived from the collector of transistor $T_8$ through capacitor $C_8$ and rectified by diodes Di1, Di2 to finally obtain the control signal. The collector of transistor $T_8$ further supplies the amplified output signal of the auxiliary oscillator to be supplied to microprocessor 14.

The above disclosed embodiment of the auxiliary oscillator 16 generally shown in FIG. 1 requires only a few electronic components and may be easily designed in integrated form. Its performance is excellent with respect to the absence of harmonics and a stable, low level of its output signal. Therefore, this oscillator is particularly useful in the tuning system of FIG. 1.

It should be understood that the invention is in no way limited to the above disclosed embodiments and that many modifications may be brought thereto without departing from the true spirit of the invention.

What is claimed is:

1. A tuning system for a high frequency receiver comprising
   at least one tunable resonance circuit the resonance frequency of which is determined by a variable inductivity element formed by a signal winding of a controllable inductor and a control winding fed by a tuning control current,
   an auxiliary variable frequency oscillator having an oscillating frequency determined by said control winding, said control winding being used as a frequency determinative inductance of said auxiliary variable frequency oscillator; and a frequency control loop connected between said auxiliary variable frequency oscillator and said resonant circuit for controlling said oscillating frequency of said auxiliary variable frequency oscillator for a predetermined constant ratio of said resonance frequency of said tunable resonance circuit to said oscillating frequency, said frequency control loop comprising
   comparing means for comparing a frequency value corresponding to said resonance frequency of said tunable resonance circuit with said oscillating frequency of said auxiliary variable frequency oscillator and generating a control signal representing the difference between said resonance and oscillating frequencies, and
   converting means for converting said control signal into said control current for feeding said control winding of said controllable inductor.

2. The tuning system of claim 1, wherein for any particular inductor used, at least two values of said predetermined constant ratio are determined for two different resonance frequencies of said tunable resonance circuit, and further comprising a read-only memory for storing said two values.

3. The tuning system of claim 2, wherein said at least two values are determined empirically.

4. The tuning system of claim 2 or 3, wherein said resonance frequency of said tunable resonance circuit is a non-linear function of said oscillating frequency of said auxiliary variable frequency oscillator, and wherein a plurality of values of said ratio of said resonance frequency to said oscillating frequency are stored in said read-only memory, said plurality of values approximating the characteristic of said non-linear function.

5. The tuning system of claim 2 or 3, wherein said resonance frequency of said tunable resonance circuit is a substantially linear function of said oscillating frequency of said auxiliary variable frequency oscillator, and wherein only a few values of the ratio of said resonance frequency to said oscillating frequency are determined and stored in said read-only memory.

6. The tuning system of claim 5, wherein said few values are those associated with a first, lower resonance frequency and with a second, higher resonance frequency, said lower and higher frequencies defining the tuning range of said tuning system.

7. The tuning system of claim 1, wherein said inductor has a symmetric twin core having a center leg carrying said control winding and having two outer legs each carrying one portion of said signal winding.

8. The tuning system of claim 7, wherein said signal coil portions are series connected with opposite winding sense.

9. The tuning system of claim 7 or 8 wherein said center leg has a first cross-section and said outer legs have a second cross-section, the ratio of said first to said second cross-sections being determined to have substantially the same value of permeability of the center leg and of the outer legs under operating conditions.

10. The tuning system of claim 9, wherein said ratio of said first to said second cross-sections has a value of at least 2.0.

11. The tuning system of claim 9, wherein said ratio of said first to said second cross-sections has a value of 2.0 through 2.7.

12. The tuning system of claim 10, wherein said ratio of said first to said second cross-sections has a value of 2.3 to 2.6.

13. The tuning system of claim 1, wherein said comparing means comprises a microprocessor, said microprocessor and converting means comprising a digital-analog convertor being supplied with said oscillating frequency of said auxiliary variable frequency oscillator and comparing said oscillating frequency with a frequency value associated with a desired resonance frequency of said tunable resonance circuit for generating a digital control signal depending on the results of said comparison, said digital control signal being supplied to said digital-analog converter the output signal of which is proportional to said control current fed to said control winding of said inductor.

14. The tuning system of claim 13, wherein said digital-analog converter is formed as an integrating circuit.

15. The tuning system of claim 13 or 14, wherein a voltage-current converter is controlled by the output signal of said digital-analog converter to generate said control current.

16. The tuning system of claim 1, wherein said tunable resonance circuit is an antenna circuit.

17. The tuning system of claim 16, wherein said antenna circuit is tunable to the reception frequencies within the range of AM broadcasting frequencies.

18. The tuning system of claim 1, wherein said oscillating frequency of said auxiliary variable frequency oscillator being very small compared to the resonant frequency of said tunable resonance circuit.

19. The tuning system of claim 1, wherein said auxiliary variable frequency oscillator produces an oscillating current in said control winding, said oscillating current being very low compared to said control current.

20. The tuning system of claim 1, comprising an amplitude control circuit adjusting the oscillating amplitude of said auxiliary variable frequency oscillator to a value below that susceptible of producing harmonic interference.

21. The tuning system of claim 1, wherein said auxiliary variable frequency oscillator comprises:
   a first transistor the collector circuit of which includes said signal coil;
   a second transistor the base of which is fed by a signal derived from the collector circuit of said first transistor, and the emitter circuit of which is connected in parallel with the emitter circuit of said first transistor;
   a constant current source feeding both emitter circuits of said first and second transistor.

22. The tuning system of claim 21, wherein the current supplied by said constant current source is adjusted by an adjusting signal derived from the output signal of said auxiliary variable frequency oscillator.

* * * * *